MANUFACTURE OF SEMICONDUCTOR DEVICES

Filed Aug. 17, 1955 2 Sheets-Sheet 1

INVENTORS
RALPH DAVID KNOTT
ANTHONY BAGNOLD SOWTER
MICHAEL RUPERT PLATTEN YOUNG
BY
ATTORNEY

June 7, 1960 R. D. KNOTT ET AL 2,939,204

MANUFACTURE OF SEMICONDUCTOR DEVICES

Filed Aug. 17, 1955 2 Sheets-Sheet 2

INVENTORS
RALPH DAVID KNOTT
ANTHONY BAGNOLD SOWTER
MICHAEL RUPERT PLATTEN YOUNG
BY
ATTORNEY

United States Patent Office 2,939,204

Patented June 7, 1960

2,939,204

MANUFACTURE OF SEMICONDUCTOR DEVICES

Ralph David Knott, North Greenford, Anthony Bagnold Sowter, Ickenham, and Michael Rupert Platten Young, Wembley, England, assignors to The General Electric Company Limited, London, England Filed Aug. 17, 1955, Ser. No. 528,895

Claims priority, application Great Britain Aug. 23, 1954

4 Claims. (Cl. 29—25.3)

This invention relates to the manufacture of semiconductor devices.

Semiconductor devices having at least one P–N junction, such as rectifiers, transistors etc., are highly sensitive to overloading or excessive junction temperature, for which reason it has become known to mount the devices upon a relatively heavy metal body or base of high heat conducting material, which may be provided with some sort of metal cooling fin and may serve as a terminal for one of the junction elements of the device. In other words, the mounting base acts as a "heat sink" by providing a low thermal resistance, to make overloads possible for longer periods of time without permanent damage to the semiconductor. Besides, it is customary to enclose the semiconductor device in a sealed metal envelope to cause its electrical characteristics to vary but little over prolonged periods of use or operation.

According to the invention, in a method of manufacturing a semiconductor device provided with a hermetically sealed envelope at least one seal made in the envelope after the operative part of the device is mounted therein is made by cold pressure welding.

Preferably each such seal is made by cold pressure welding.

The use of cold pressure welding involves no risk of damage to the operative part of the device either by the evolution of heat or by chemical attack by a material such as a soldering flux. This is particularly advantageous where the device is small and where the operative part of the device includes a portion consisting of a readily fusible material, such as indium. A further advantage of the use of cold pressure welding is that it enables the sealing operations to be carried out conveniently in an inert atmosphere, such as dry nitrogen, so as to provide a permanent inert gas filling for the envelope.

According to a feature of the invention, a method of manufacturing a rectifier comprises the steps of mounting a semiconductor body on a metal body provided with a thin projecting flange, the semiconductor body containing a P–N junction and being mounted with the region of one conductivity type of ohmic connection with the metal body and being provided with a lead wire in ohmic connection with the region of opposite conductivity type, disposing a hollow metal cap provided around its mouth with a projecting thin flange so that the face of this flange is in contact with the face of the flange on the metal body and so that the lead wire passes through a metal tube which is sealed through a body of electrically insulating material sealed in the wall of the cap, cold pressure welding the two flanges together, and cold pressure welding the lead wire to the metal tube.

Figure 1:
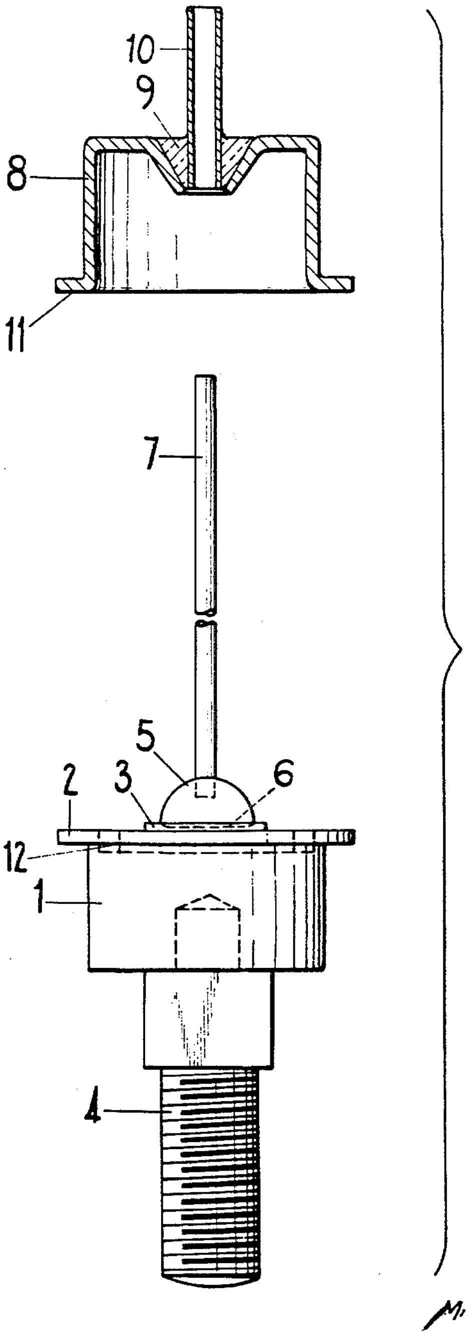

One arrangement in accordance with the invention will now be described by way of example with reference to the accompanying drawings, in which:

Figure 1 is an elevation, partly in section, of parts of a

Figure 2:
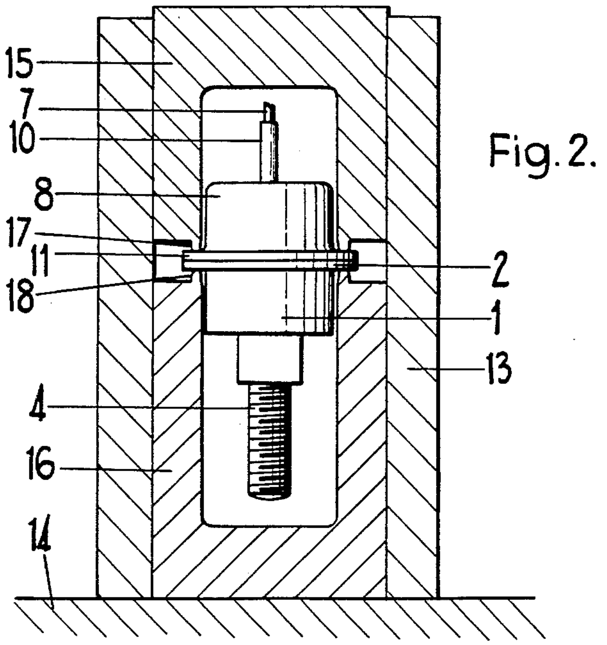
Figure 3:
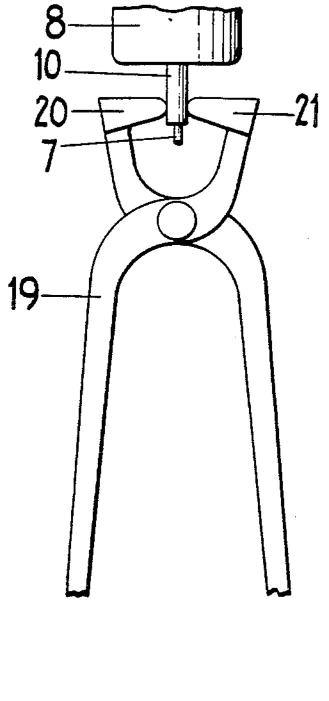

P–N junction rectifier just before the final assembly of the rectifier;

Figure 2 illustrates the first stage in the sealing of the envelope of the rectifier shown in Figure 1; and Figure 3 illustrates the final stage in the sealing of the envelope of the rectifier shown in Figure 1.

Referring to Figure 1 of the drawings, the rectifier includes a circular cylindrical block 1 of oxygen free high conductivity copper having a diameter of 11.9 millimetres which is provided at one end with a thin peripheral flange 2 having an outer diameter of 14.7 millimetres and a thickness of approximately 0.65 millimetre. To this end of the block 1 is soldered one main face of a plate 3 of N-type germanium, and a threaded fixing stud 4 is soldered into a hole in the other end of the block 1. A small region of P-type germanium is formed in the plate 3 in known manner by fusing to its second main face a small quantity of indium so as to form a bead 5 at the base of which is a P–N junction 6. The soldering of the plate 3 to the block 1 and the formation of the P-type region are conveniently carried out simultaneously by heating the component parts while holding them together in a jig. An ohmic connection to the region of P-type germanium is provided by means of a nickel lead wire 7 of diameter one millimetre, whose end is embedded in the bead 5.

The main part of the envelope of the rectifier is constituted by a circular cylindrical cap 8 of oxygen free high conductivity copper having an external diameter equal to the diameter of the copper block 1. In the closed end of the cap 8 is sealed a glass bead 9, through the centre of which is sealed a nickel tube 10 having an internal diameter of 1.2 millimetres and an external diameter of 1.5 millimetres; the open end of the cap 8 is provided with a thin peripheral flange 11 having an external diameter and thickness the same as those of the flange 2 on the block 1.

The parts shown in Figure 1 having been fabricated, the external faces of the flanges 2 and 11 (that is the upper face of the flange 2 and the lower face of the flange 11 as shown in Figure 1) are cleaned by scratch brushing with a rotating steel wire brush, the operative part of the rectifier comprising the plate 3 and bead 5 being protected from damage during the cleaning of the flange 2 by means of a metal tube (not shown) which is slipped over the lead wire 7 and whose end fits into an annular groove 12 provided in the end of the block 1. The cap 8 is then placed over the end of the block 1 so that the external faces of the flanges 2 and 11 are in contact and the wire 7 passes through the tube 10, the wire 7 being cropped off at a short distance beyond the outer end of the tube 10.

Referring now to Figure 2 of the drawings, the parts assembled as described above are disposed in a cold pressure welding tool which comprises a steel tube 13 mounted on a base plate 14, and a pair of hardened steel cylindrical punches 15 and 16 which are a sliding fit inside the tube 13. The punches 15 and 16 are recessed to accommodate the rectifier, and are provided at their welding faces with annular ridges 17 and 18 respectively, which each project approximately 0.65 millimetre, the plane faces of the ridges 17 and 18 having inner and outer diameters of 12.3 and 14.2 millimetres respectively, and the lateral faces of the ridges 17 and 18 being tapered at angles of 7° to the axis of the punches 15 and 16. The parts of the rectifier are assembled in the welding tool with the flanges 2 and 11 sandwiched between the punches 15 and 16, and a pressure of about six tons is applied to the outer end of the punch 15 to force it through the tube 13 and thereby weld the flanges 2 and 11 together. The reduction in thickness of the flanges 2 and 11 in the welded region is made such that the final combined thickness of the flanges 2 and 11 in this region is of the order of 0.15 millimetre, this result being secured by making the length of the tube 13 this amount in excess of the sum of the lengths of the punches 15 and 16. During the welding operation, a radial flow of metal occurs, the inward flow being accommodated by the groove 12 (see Figure 1), and the outward flow being accommodated by making the internal diameter of the tube 13 sufficiently large; after the welding the external diameter of the flanges 2 and 11 is increased to 16.7 millimetres.

The rectifier is then removed from the welding tool, and a final seal is made in the envelope by cold pressure welding the tube 10 and wire 7 together at the outer end of the tube 10. As shown in Figure 3 of the drawings, this operation is carried out by means of hand cutters 19, having hardened steel blades 20 and 21 whose lengths are considerably greater than the diameter of the tube 10 and whose edges have circular cross-sections of radii 0.75 millimetre. The blades 20 and 21 are brought together to pinch off the tube 10 and the wire 7, which are sealed together by this operation. It will be appreciated that the surfaces of the tube 10 and the wire 7 which are to be welded together should be relatively clean; however, provided that reasonable care is taken to prevent contamination of these surfaces, no special cleaning operation is necessary immediately before the welding operation.

During the two welding operations described above, the parts of the rectifier and the welding tools are maintained inside a sealed enclosure (not shown) in which an atmosphere of dry nitrogen is established, the enclosure being provided with ports to which are sealed rubber gloves to enable an operator to manipulate the parts inside the enclosure.

It will be appreciated that in the method described above no heat is applied to the rectifier during the sealing operations, so that there is no risk of damage to the rectifier, due for example to fusion of the solder or the indium, which might occur if heat was applied during the sealing operations.

Moreover, the groove 12 has the additional effect of preventing internal stress of deformation of the plate or body 1 supporting the semiconductor element as a result of the inward metal displacement during welding. Since the crystal structure of a semiconductor is highly sensitive to mechanical stress, the groove 12, in addition to allowing an unimpeded metal flow conducive to cold pressure welding, acts as a protective means for the rectifier or other device supported by or mounted upon the base or body 1.

It will further be appreciated that the invention may be utilised in manufacturing semiconductor devices other than rectifiers; for example the invention may be applied to the manufacture of transistors of any type known in the art.

We claim:

1. A method of manufacturing a rectifier, comprising the steps of mounting a semiconductor body on a metal body provided with a thin projecting flange, the semiconductor body containing a P–N junction and being mounted with the region of one conductivity type in ohmic connection with the metal body and being provided with a lead wire in ohmic connection with the region of opposite conductivity type, disposing a hollow metal cap provided around its mouth with a projecting thin flange so that the face of this flange is in contact with the face of the flange on the metal body and so that the lead wire passes through a metal tube which is sealed through a body of electrically insulating material sealed in the wall of the cap, cold pressure welding the two flanges together, and cold pressure welding the lead wire to the metal tube.

2. In a method of fabricating a hermetically sealed semiconductor device, the steps of mounting a semiconductor body provided with a terminal lead in mechanical and electrical contact with a metal base forming a cooperating terminal of said device and provided with a thin peripheral projecting flange, disposing a hollow metal cap provided around its mouth with a projecting flange so that the face of said last flange is in contact with the face of said first flange and so that said terminal lead passes through a metal tube insulatingly sealed in the wall of said cap, said lead, said base, said cap and said tube all consisting of cold pressure weldable material, cold pressure welding said two flanges together, and cold pressure welding said lead to said tube.

3. In a method of fabricating a hermetically sealed semiconductor device, the steps of mounting a semiconductor body provided with a terminal lead in mechanical and electrical connection with a metal base forming a cooperating terminal of said device and provided with a thin peripheral projecting flange and a groove parallel to and located inwardly of and closely spaced from said flange, disposing a metal cap provided around its mouth with a projecting flange similar to said first flange so that the face of said last flange is in contact with the face of said first flange and so that said terminal lead passes through a tubular metal member insulatingly sealed in the wall of said cap, said lead, said base, said cap and said member consisting of cold pressure weldable material, cold pressure welding said two flanges together by indenting a strip-like annular area thereof, to create an interfacial metal flow outwardly and inwardly of said area towards said groove such as to join said flanges in a solid phase welding bond at said area, and cold pressure welding said lead to said member.

4. In a method of fabricating a hermetically sealed semiconductor device, the steps of mounting a semiconductor body provided with a terminal lead in mechanical and electrical contact with a metal base forming a cooperating terminal of said device and provided with a thin peripheral projecting flange, disposing a hollow metal cap provided around its mouth with a projecting flange so that the face of said last flange is in contact with the face of said first flange and said cap provided with a tubular opening so that said terminal lead passes through said tubular opening, said two flanges consisting of cold pressure weldable material, cold pressure welding said two flanges together, and sealing said lead to said tubular opening.

References Cited in the file of this patent

UNITED STATES PATENTS

| | | |
|---|---|---|
| 2,360,279 | Rollert | Oct. 10, 1944 |
| 2,608,887 | Sowter | Sept. 2, 1952 |
| 2,664,528 | Stelmak | Dec. 29, 1953 |
| 2,703,855 | Koch et al. | Mar. 8, 1955 |
| 2,745,045 | Ingraham | May 8, 1956 |